(12) United States Patent
Kim

(10) Patent No.: US 10,057,517 B2
(45) Date of Patent: Aug. 21, 2018

(54) ANALOG-DIGITAL CONVERTING DEVICE AND METHOD, AND IMAGE SENSOR INCLUDING THE SAME

(71) Applicant: SK hynix Inc., Gyeonggi-do (KR)

(72) Inventor: Tae-Gyu Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 34 days.

(21) Appl. No.: 15/435,500

(22) Filed: Feb. 17, 2017

(65) Prior Publication Data

US 2017/0353677 A1    Dec. 7, 2017

(30) Foreign Application Priority Data

Jun. 3, 2016 (KR) ................ 10-2016-0069312

(51) Int. Cl.
| | |
|---|---|
| *H04N 5/357* | (2011.01) |
| *H04N 5/3745* | (2011.01) |
| *H04N 5/378* | (2011.01) |
| *H04N 5/363* | (2011.01) |
| *H03M 1/56* | (2006.01) |
| *H03M 1/12* | (2006.01) |

(52) U.S. Cl.
CPC .......... *H04N 5/3575* (2013.01); *H03M 1/56* (2013.01); *H04N 5/363* (2013.01); *H04N 5/378* (2013.01); *H04N 5/37455* (2013.01); *H03M 1/123* (2013.01); *H03M 1/1295* (2013.01)

(58) Field of Classification Search
CPC .................................................. H04N 5/3575
USPC ............................................................ 348/308
See application file for complete search history.

(56) References Cited

U.S. PATENT DOCUMENTS 9,490,833 B2 * 11/2016 Lee .................... H03M 1/36

FOREIGN PATENT DOCUMENTS

| KR | 1020040105454 | 12/2004 |
|---|---|---|
| WO | WO 2008/018721 | 2/2008 |

* cited by examiner

*Primary Examiner* — Joel Fosselman
(74) *Attorney, Agent, or Firm* — IP & T Group LLP

(57) ABSTRACT

An analog-digital converting device includes a comparison block generating at least one first comparison signal by comparing pixel signals with each other, and for generating second comparison signals by comparing each of the plurality of pixel signals with a ramp signal through a single ramping operation; a feedback control unit determining a data conversion sequence according to the at least one first comparison signal received from the comparison block, and outputting a control signal according to the determined data conversion sequence; a selection block selecting two of the plurality of the pixel signals or at least one of the plurality of the pixel signals and the ramp signal to be applied to the comparison block according to the control signal received from the feedback control unit; and a data conversion unit performing a data conversion on the plurality of pixel signals based on the second comparison signal.

9 Claims, 7 Drawing Sheets

ANALOG-DIGITAL CONVERTING DEVICE AND METHOD, AND IMAGE SENSOR INCLUDING THE SAME

CROSS-REFERENCE TO RELATED APPLICATIONS

The present application claims priority of Korean Patent Application No. 10-2016-0069312, filed on Jun. 3, 2016, which is incorporated herein by reference in its entirety.

BACKGROUND

1. Field

Exemplary embodiments of the present invention relate to an image sensor and, more particularly, to an analog-digital converting device and method, and an image sensor including the device.

2. Description of the Related Art

In general, an image sensor, such as a complementary metal oxide semiconductor (CMOS) image sensor, converts an analog signal (i.e., a pixel signal) into a digital signal (i.e., a pixel data) unlike a solid state pick-up device.

CMOS image sensors are widely used because of lower power consumption, lower cost and smaller size. Especially, CMOS image sensor provide excellent image quality and thus they are widely used in the video field which requires high resolution and high speed frame rate.

CMOS image sensors use correlated double sampling (CDS) to remove an offset pixel value. Generally, through CDS, a pixel signal from an incident light is measured by comparing a reset pixel signal measured before the reception of the incident light with an image pixel signal measured after the reception of the incident light.

In a CMOS image sensor, a difference value between the image signal and the reset signal, which are sampled through the CDS, is counted and converted into a digital signal.

When each pixel signal is converted into a digital signal, a sequentially rising or falling ramp signal is used in the CMOS image sensor. The CDS has an advantageous noise characteristic since the CDS outputs a difference value between the reset signal and the image signal, and removes a line resistance characteristic according to a location and a process variation (e.g., a threshold voltage variation) of a transistor in a pixel.

However, a width of an analog-digital converting device disposed under a unit pixel becomes decreased while a length thereof becomes increased as a pitch between unit pixels shrinks under a micro-meter in the CMOS image sensor, which leads to the decrease of substantially available width and length of the analog-digital converting device and causes a flicker noise problem and a mismatch problem.

Thus, it would be desirable to reduce a chip area and power consumption and improve a noise characteristic of an analog-digital converting device for a CMOS image sensor capable of a high resolution and a high speed operation.

SUMMARY

Various embodiments of the present invention are directed to an improved analog-digital converting device and method and an image sensor including the device that address the aforementioned concerns of existing devices. The analog-digital converting device, method and an image sensor including the device may convert a plurality of pixel signals through a single ramping operation by determining a sequence of signal conversion according to the sizes of the pixel signals.

In an embodiment of the present invention, an analog-digital converting device includes a comparison block suitable for generating at least one first comparison signal by comparing a plurality of pixel signals with each other, and for generating a plurality of second comparison signals by comparing each of the plurality of pixel signals with a ramp signal through a single ramping operation; a feedback control unit suitable for determining a data conversion sequence according to the at least one first comparison signal received from the comparison block, and outputting a control signal according to the determined data conversion sequence; a selection block suitable for selecting two of the plurality of the pixel signals or at least one of the plurality of the pixel signals and the ramp signal to be applied to the comparison block according to the control signal received from the feedback control unit; and a data conversion unit suitable for performing a data conversion on the plurality of pixel signals based on the second comparison signal.

The comparison block may include a comparator suitable for comparing the selected pixel signals among the plurality of pixel signals with each other, and for comparing a selected pixel signal among the plurality of pixel signals with the ramp signal, and the comparison block may further remove an offset by resetting the comparator through a reference pixel signal.

The comparison block may compare each of the plurality of pixel signals, which are selected according to the control signal, with the ramp signal according to the determined data conversion sequence.

In an embodiment of the present invention, an analog-digital converting method may include performing a reset operation; generating a first comparison signal by comparing a plurality of pixel signals with each other; determining a data conversion sequence according to the first comparison signal; generating a control signal according to the determined data conversion sequence; selecting the plurality of pixel signals and a ramp signal according to the control signal; and performing a data conversion on the plurality of pixel signals by comparing each of the plurality of pixel signals, which are selected according to the control signal, with the ramp signal through a single ramping operation.

The performing of the reset operation may include removing an offset for the comparing of the plurality of pixel signals with each other using a reference pixel signal.

In an embodiment of the present invention, a complementary metal oxide semiconductor (CMOS) image sensor may include a pixel array suitable for outputting a pixel signal corresponding to an incident light; a row decoder suitable for selecting and controlling a pixel at each row lines of the pixel array; a ramp signal generation unit suitable for generating a ramp signal; a comparison unit suitable for comparing a plurality of pixel signals outputted from the pixel array, determining a data conversion sequence of the pixel signals, and comparing each of the plurality of pixel signals with the ramp signal through a single ramping operation; a counting unit suitable for counting a clock according to a comparison signal of the comparison unit; a memory unit suitable for storing a counting information of the counting unit; and a column read-out circuit suitable for outputting a data of the memory unit.

The comparison unit may include a comparison block suitable for generating a first comparison signal by comparing the plurality of pixel signals with each other, and generating a second comparison signal by comparing each of the plurality of pixel signals with the ramp signal through the single ramping operation; a feedback control unit suitable for determining the data conversion sequence according to the first comparison signal, and outputting a control signal according to the determined data conversion sequence; a selection block suitable for selecting the plurality of pixel signals and the ramp signal applied to the comparison block according to the control signal; and a data conversion unit suitable for performing a data conversion on the plurality of pixel signals based on the second comparison signal.

BRIEF DESCRIPTION OF THE DRAWINGS

The above and other features and advantages of the present invention will become more apparent to those skilled in the art to which the present invention belongs by the following detailed description with reference to the attached drawings in which.

DETAILED DESCRIPTION

Figure 1:
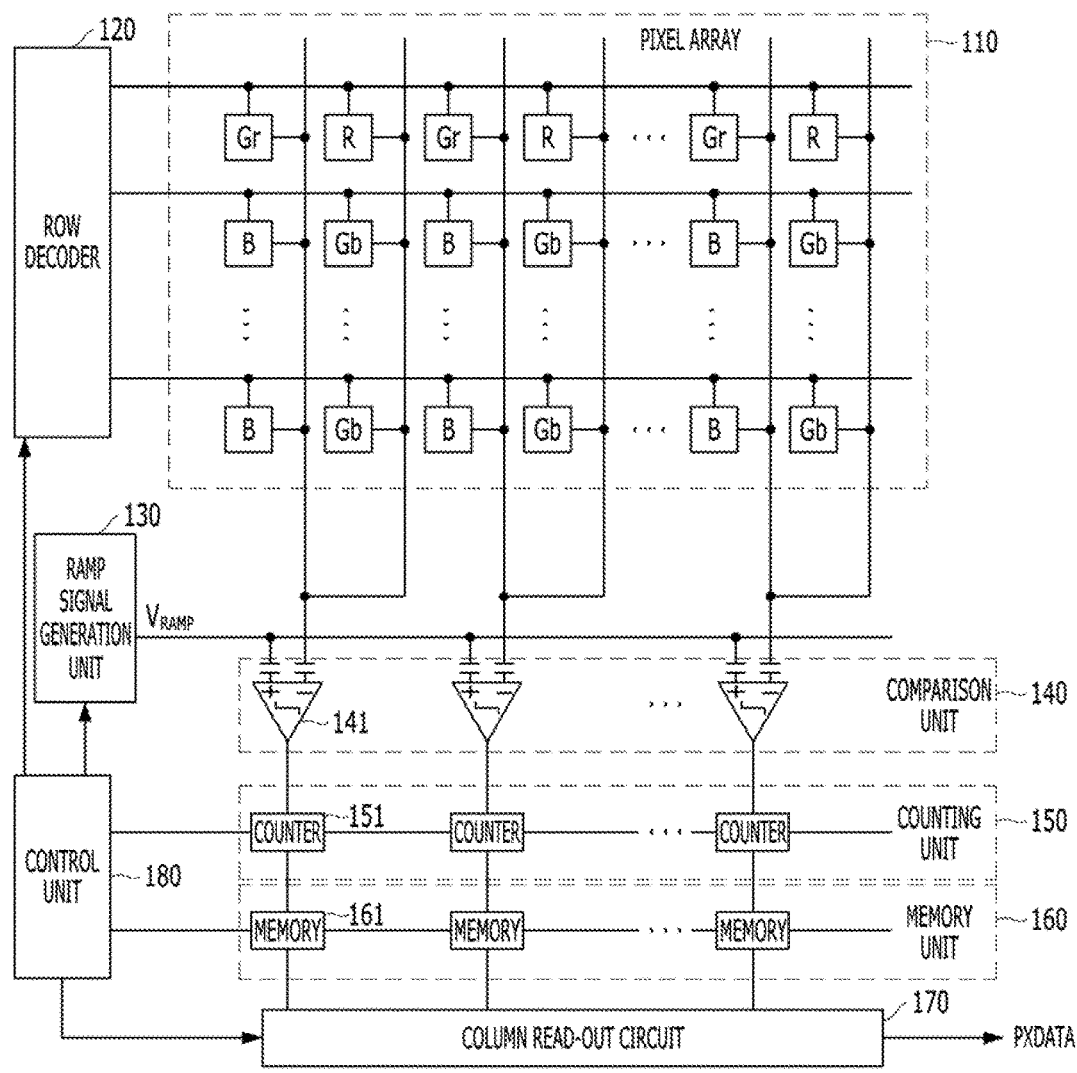
FIG. 1 is a block diagram illustrating a typical CMOS image sensor.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Throughout the specification, when an element is referred to as being "coupled" to another element, it may not only indicate that the elements are "directly coupled" to each other, but also Indicate that the elements are "electrically coupled" to each other with another element Interposed therebetween.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily drawn to scale and, in some instances, proportions may have been exaggerated in order to clearly illustrate features of the embodiments.

The terminology used herein is for the purpose of describing particular embodiments only and is not Intended to be limiting of the present invention. As used herein, singular forms are Intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail to avoid unnecessarily obscuring the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a typical CMOS image sensor, and illustrates an operation of converting data by a single analog-digital converting device per two columns.

Referring to FIG. 1, the typical CMOS image sensor includes a pixel array 110, a row decoder 120, a ramp signal generation unit 130, a comparison unit 140, a counting unit 150, a memory unit 160, a column read-out circuit 170, and a control unit 180.

The pixel array 110 outputs a pixel signal corresponding to an incident light.

The row decoder 120 selects and controls a pixel at each of row lines in the pixel array 110 according to the control of a control unit 180 (e.g., a timing generator).

The ramp signal generation unit 130 generates a ramp signal $V_{RAMP}$ under the control of the control unit 180.

The comparison unit 140 compares sequentially the ramp signal $V_{RAMP}$ outputted from the ramp signal generation unit 130 with pixel signals outputted from the pixel array 110.

The counting unit 150 counts a clock of the control unit 180 according to output signals of the comparison unit 140.

The memory unit 160 stores counting information outputted from the counting unit 150 under the control of the control unit 180.

The column read-out circuit 170 sequentially outputs the counting Information stored in the memory unit 160 as a pixel data PXDATA under the control of the control unit 180.

The control unit 180 controls the row decoder 120, the ramp signal generation unit 130, the counting unit 150, the memory unit 160 and the column read-out circuit 170.

Herein, the comparison unit 140 includes a plurality of comparators, the counting unit 150 includes a plurality of counters, and the memory unit 160 includes a plurality of memories. A single comparator, a single counter and a single memory correspond to each two columns.

Operations of the single comparator, the single counter and the single memory will be exemplarily described as below.

A first comparator 141 among the plurality of comparators in the comparison unit 140 receives two pixel signals respectively outputted from first and second columns of the pixel array 110 through a terminal of the first comparator 141, and receives the ramp signal $V_{RAMP}$ outputted from the ramp signal generation unit 130 through the other terminal of the first comparator 141. The first comparator 141 compares the ramp signal $V_{RAMP}$, which is firstly ramped from the ramp signal generation unit 130, with the pixel signal outputted from the first column of the pixel array 110, outputs a comparison value. The first comparator 141 further compares the ramp signal $V_{RAMP}$, which is secondarily ramped from the ramp signal generation unit 130, with the pixel signal outputted from the second column of the pixel array 110, and outputs a comparison value.

Herein, since a voltage level of the ramp signal $V_{RAMP}$ fluctuates as a time elapses, there are breakpoints between the ramp signal $V_{RAMP}$ and the pixel signal. The value of the comparison signal is inverted at every breakpoint.

Thus, a first counter 151 among the plurality of counters in the counting unit 150 counts the clock outputted from the control unit 180 between a time of rising or falling of the ramp signal $V_{RAMP}$ and a time of inversion of the comparison signal outputted from the comparator 141, and outputs the counting information. Herein, each counter is reset in response to a reset signal outputted from the control unit 180.

A first memory 161 among the plurality of memories in the memory unit 160 stores the counting information outputted from the first counter 151 according to a load signal of the control unit 180, and outputs the counting information to the column read-out circuit 170.

In case that a single analog-digital converting device per two columns is arranged as illustrated in FIG. 1, a space required for the analog-digital converting device is increased and the data conversion of two pixel signals at a single row requires increased operation speed. The increased operation speed requires greater power consumption, and deteriorates a noise characteristic.

Figure 2:
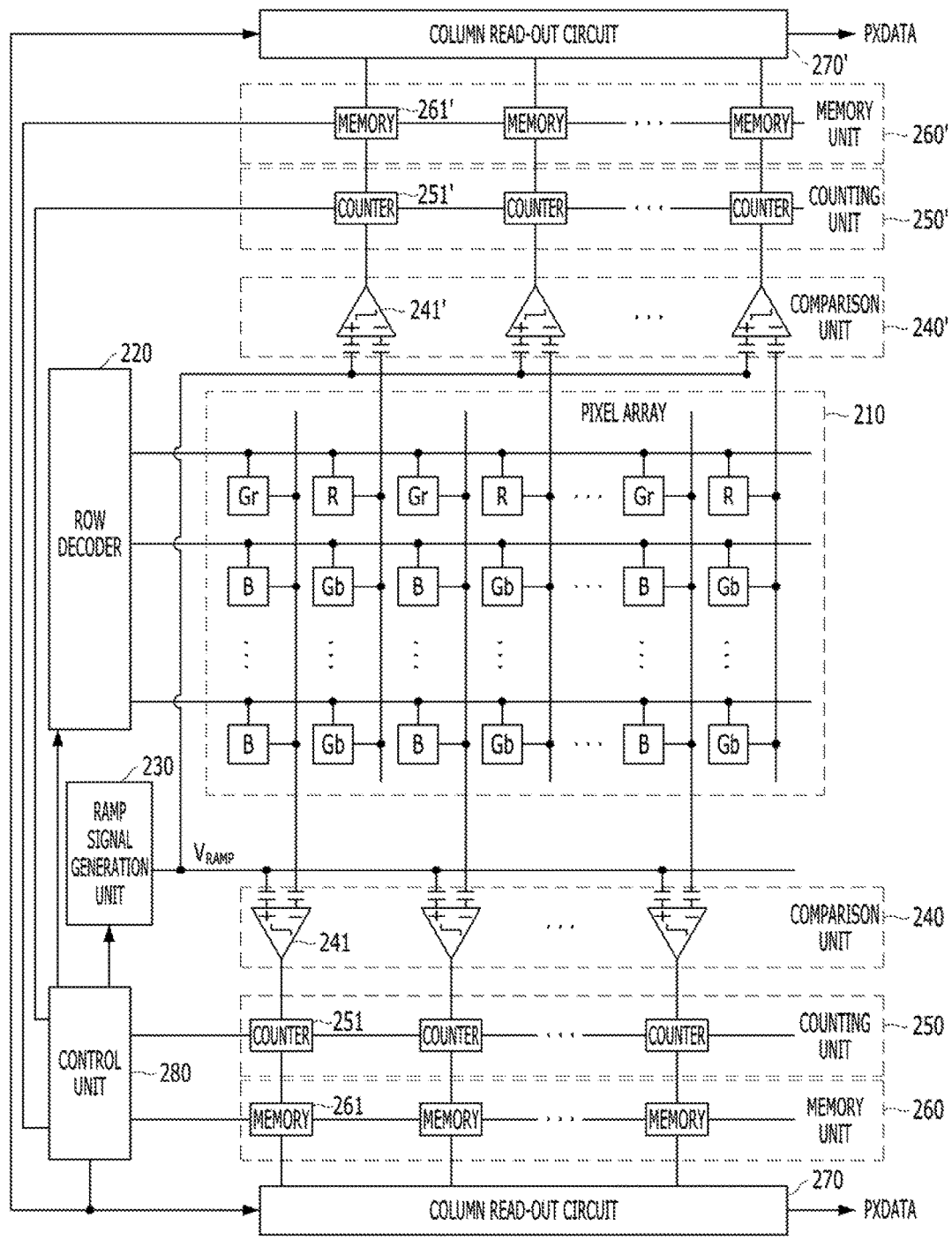
FIG. 2 is a block diagram illustrating another typical CMOS image sensor.

FIG. 2 is a block diagram illustrating another typical CMOS image sensor, and illustrates an operation of converting data by a single analog-digital converting device per two columns and the analog-digital converting devices arranged alternately in an upper portion region and a lower portion region.

As shown in FIG. 2, another typical CMOS image sensor includes a pixel array 210, a row decoder 220, a ramp signal generation unit 230, comparison units 240 and 240', counting units 250 and 250', memory units 260 and 260', column read-out circuits 270 and 270' and a control unit 280.

The pixel array 210 outputs a pixel signal corresponding to an incident light.

The row decoder 220 selects and controls a pixel at each of row lines in the pixel array 210 under the control of a control unit 280 (e.g., a timing generator).

The ramp signal generation unit 230 generates a ramp signal $V_{RAMP}$ under the control of the control unit 280.

Each of the comparison units 240 and 240' compares the ramp signal $V_{RAMP}$ outputted from the ramp signal generation unit 230 with pixel signals outputted from the pixel array 210.

Each of the counting units 250 and 250' counts a clock of the control unit 280 according to an output signal of each of the comparison units 240 and 240'.

Each of the memory units 260 and 260' stores a counting information outputted from each of the counting units 150 and 150' under the control of the control unit 280.

Each of the column read-out circuits 270 and 270' sequentially outputs the counting information stored in each of the memory units 260 and 260' as a pixel data PXDATA under the control of the control unit 280.

The control unit 280 controls the row decoder 220, the ramp signal generation unit 230, the counting units 250 and 250', the memory units 260 and 260' and the column read-out circuits 270 and 270'.

Herein, each of the comparison units 240 and 240' includes a plurality of comparators, each of the counting units 250 and 250' includes a plurality of counters, and each of the memory units 260 and 260' includes a plurality of memories. A single comparator, a single counter and a single memory correspond to each column.

Operations of the single comparator, the single counter and the single memory will be exemplarily described as below.

A first comparator 241 among the plurality of comparators in the comparison unit 240 receives a pixel signal outputted from a first column of a pixel array 210 through a terminal of the first comparator 241, and receives the ramp signal $V_{RAMP}$ outputted from the ramp signal generation unit 230 through the other terminal of the first comparator 241. The first comparator 241 compares the ramp signal $V_{RAMP}$, which is firstly ramped from the ramp signal generation unit 230, with the pixel signal outputted from the first column of the pixel array 210, and outputs a comparison value.

A second comparator 241' among the plurality of comparators in the comparison unit 240' receives a pixel signal outputted from a second column of a pixel array 210 through a terminal of the second comparator 241', and receives the ramp signal $V_{RAMP}$ outputted from the ramp signal generation unit 230 through the other terminal of the second comparator 241'. The second comparator 241' compares the ramp signal $V_{RAMP}$, which is secondarily ramped from the ramp signal generation unit 230, with the value of the pixel signal outputted from the second column of the pixel array 210, and outputs a comparison value.

Herein, since a voltage level of the ramp signal $V_{RAMP}$ fluctuates as a time elapses, there are breakpoints between the ramp signal $V_{RAMP}$ and the pixel signal. The value of the comparison signal is inverted at every breakpoint.

Thus, first and second counters 251 and 251' among the plurality of counters in each of the counting units 250 and 250' count the clock outputted from the control unit 280 between a time of rising or falling of the ramp signal $V_{RAMP}$ and a time of inversion of the comparison signals outputted from the first and second comparator 241 and 241', and output the counting information. Herein, each counter is reset in response to a reset signal outputted from the control unit 280.

First and second memories 261 and 261' among the plurality of memories in each of the memory units 260 and 260' store the counting information outputted from the first and second counters 251 and 251' according to a load signal of the control unit 280, and outputs the counting information to the column read-out circuits 270 and 270'.

In case that a single analog-digital converting device per two columns is arranged as illustrated in FIG. 2, a space required for the analog-digital converting device is increased and the data conversion of two pixel signals at a single row requires increased operation speed. The increased operation speed requires greater power consumption, and deteriorates a noise characteristic.

In various exemplary embodiments of the present invention, a total chip area is reduced, a power consumption is reduced, and a noise characteristic is improved by comparing a size of N number pixel signals, determining a data conversion sequence, and converting a plurality of pixel signals into data signals through a single ramping operation. These operations will be described with reference to FIGS. 3 to 6B.

Figure 3:
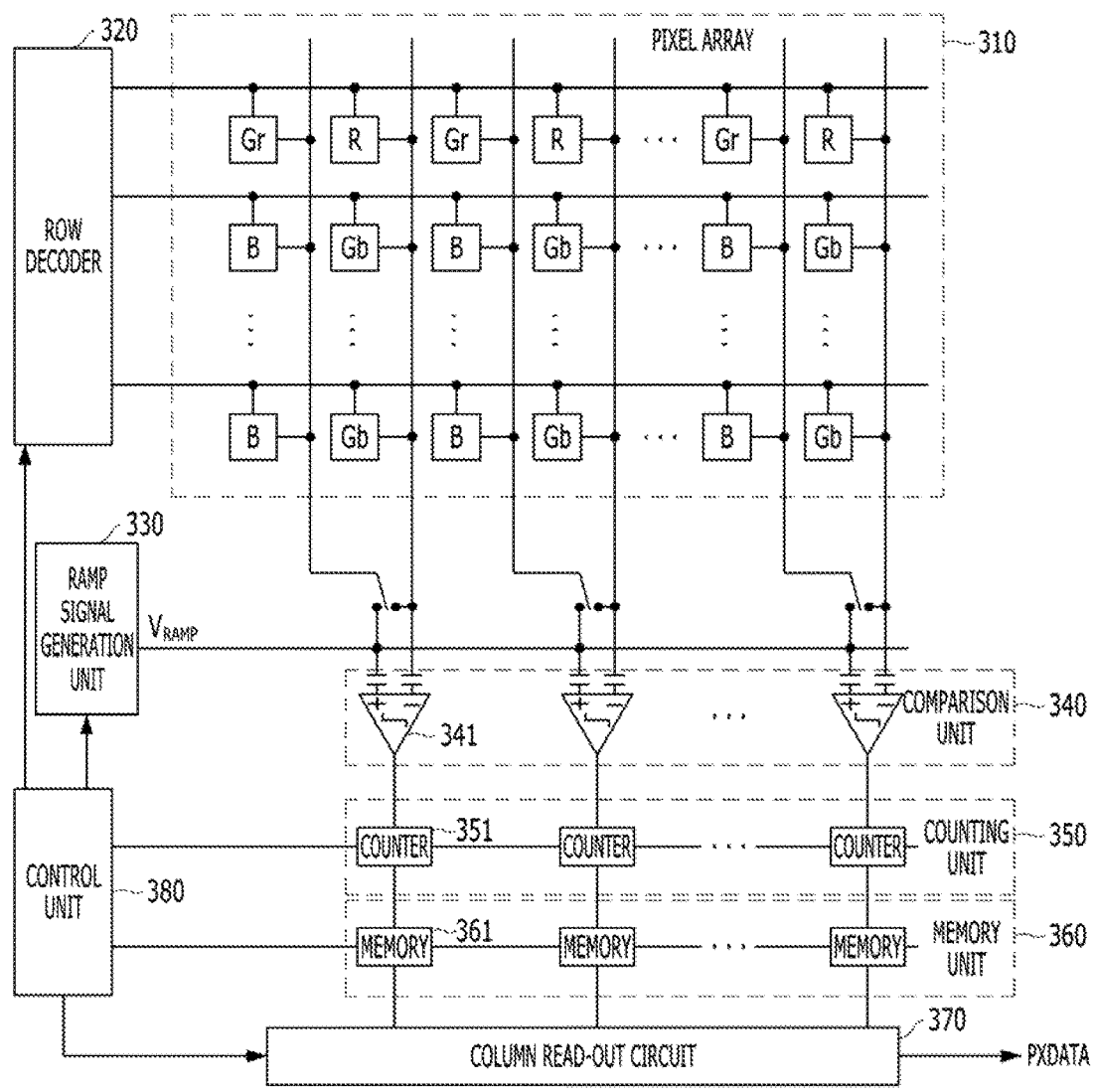
FIG. 3 is a block diagram illustrating a CMOS image sensor in accordance with an embodiment of the present invention.

FIG. 3 is a block diagram illustrating a CMOS image sensor in accordance with an embodiment of the present invention, and illustrates an operation of converting data by a single analog-digital converting device per two columns.

As shown in FIG. 3, a CMOS image sensor in accordance with an embodiment of the present invention includes a pixel array 310, a row decoder 320, a ramp signal generation unit 330, a comparison unit 340, a counting unit 350, a memory unit 360, a column read-out circuit 370 and a control unit 380.

The pixel array 310 includes a plurality of pixels arranged in rows and columns. The pixels are arranged in a plurality of 2×2 arrays which include four pixel units for detecting incident green, red and blue colour light (Gr, R, B, and Gb) and outputs a pixel signal corresponding to the incident light to a column wiring line. A plurality of row wiring lines operatively couple the pixels to the row decoder 320.

The row decoder 320 selects and controls a pixel at each of the row lines in the pixel array 310 under the control of the control unit 380. The control unit may be or include a timing generator.

The ramp signal generation unit 330 generates a ramp signal $V_{RAMP}$ under the control of the control unit 380.

The comparison unit 340 compares a size of a plurality of pixel signals outputted from the pixel array 310, determines a data conversion sequence, and compares the plurality of pixel signals with the ramp signal $V_{RAMP}$ which is received from the ramp signal generation unit 330, through a single ramping operation according to the determined data conversion sequence.

The counting unit 350 counts a clock of the control unit 380 according to each of the comparison signals of the comparison unit 340.

The memory unit 360 stores counting information for each comparison signal outputted from the counting unit 350 under the control of the control unit 180.

The column read-out circuit 370 sequentially outputs the counting information stored in the memory unit 160 as pixel data PXDATA under the control of the control unit 380.

The control unit 380 controls the row decoder 320, the ramp signal generation unit 330, the counting unit 350, the memory unit 360 and the column read-out circuit 370.

Herein, the comparison unit 340 includes a plurality of comparators, the counting unit 350 includes a plurality of counters, and the memory unit 360 includes a plurality of memories. A single comparator, a single counter and a single memory are operatively coupled in series between each of the N columns of the pixel array 310 and the column read-out circuit and control the conversion of the analog pixel signal output to a digital signal.

Operations of the single comparator, the single counter and the single memory will be exemplarily described as below.

A first comparator 341 among the plurality of comparators in the comparison unit 340 receives two pixel signals respectively outputted from first and second columns of the pixel array 310 through a terminal of the first comparator 341, and receives the ramp signal $V_{RAMP}$ outputted from the ramp signal generation unit 330 through the other terminal of the first comparator 341. The first comparator 341 compares the size of the two pixel signals, determines a data conversion sequence, compares the ramp signal $V_{RAMP}$ with the two pixel signals, which are outputted from the first and second columns of the pixel array 310, through a single ramping operation, and outputs a plurality of comparison values.

Herein, since a voltage level of the ramp signal $V_{RAMP}$ fluctuates as a time elapses, there are breakpoints between the ramp signal $V_{RAMP}$ and the pixel signals. The value of the comparison signal is inverted at every breakpoint.

Thus, a first counter 351 among the plurality of counters in the counting unit 350 counts the clock outputted from the control unit 380 between a time of rising or falling of the ramp signal $V_{RAMP}$ and a time of inversion of the comparison signal outputted from the comparator 341, and outputs the counting information. Herein, each counter is reset in response to a reset signal outputted from the control unit 380.

A first memory 361 among the plurality of memories in the memory unit 360 stores the counting information outputted from the first counter 351 according to a load signal of the control unit 380, and outputs the counting information to the column read-out circuit 370.

Figure 4A:
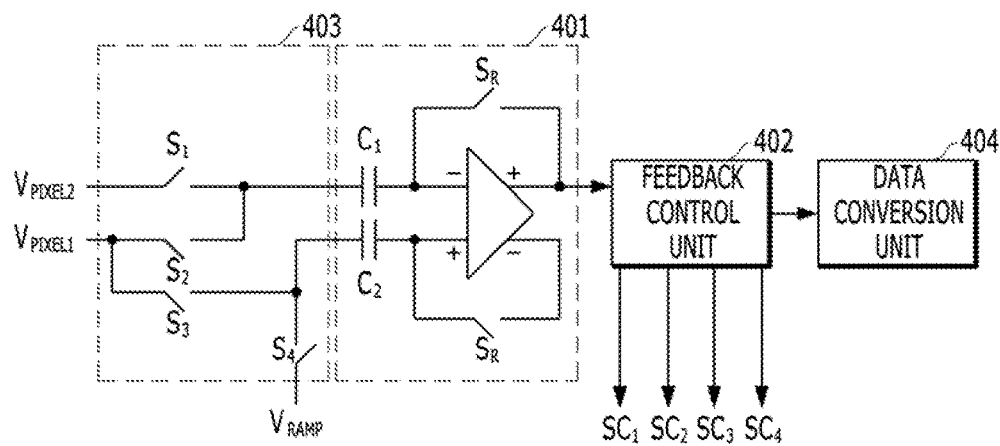
FIG. 4A is a block diagram illustrating an exemplary configuration of an analog-digital converting device shown in FIG. 3.
Figure 4B:
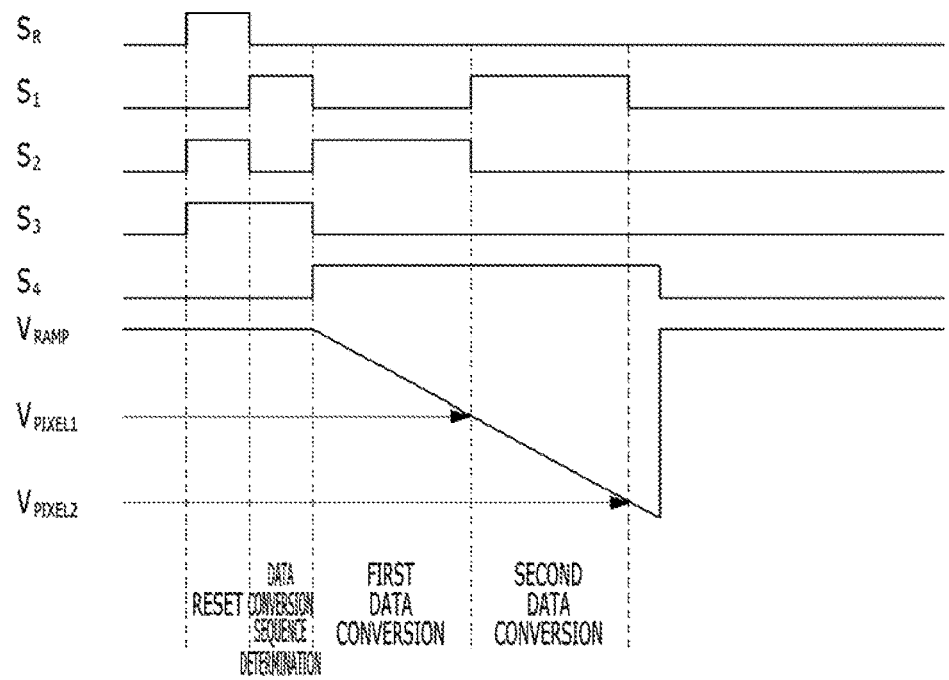
FIGS. 4B and 4C are timing diagrams illustrating control signals of the analog-digital converting device shown in FIG. 4A.
Figure 4C:
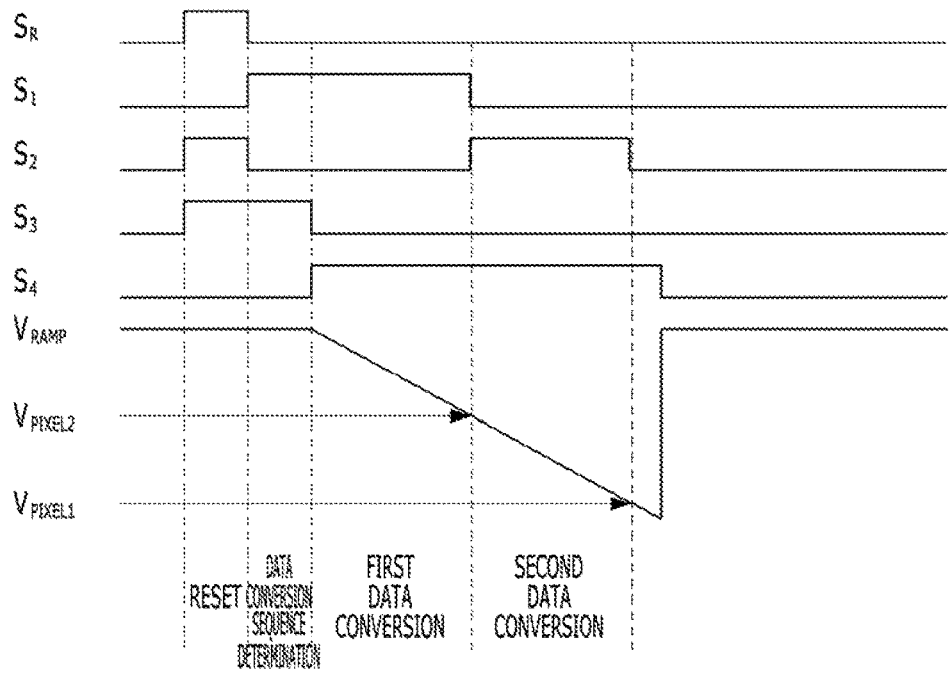
Figure 4D:
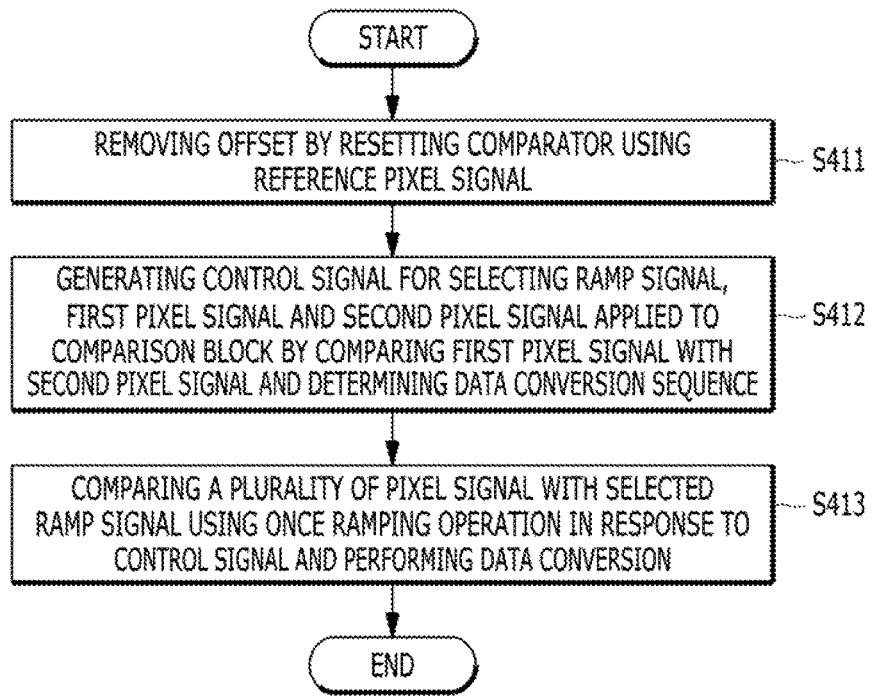
FIG. 4D is a flow chart illustrating an operation of the analog-digital converting device shown in FIG. 4A according to an embodiment of the present invention.

FIG. 4A is a block diagram illustrating an exemplary configuration for the analog-digital converting device shown in FIG. 3. FIGS. 4B and 4C are timing diagrams illustrating control signals of the analog-digital converting device shown in FIG. 4A. FIG. 4D is a flow chart illustrating an operation of the analog-digital converting device shown in FIG. 4A.

FIG. 4A shows a case that a single analog-digital converting device processes first and second pixel signals $V_{PIXEL1}$ and $V_{PIXEL2}$ of two columns through a single ramping operation, FIG. 4B shows a control signal timing when the first pixel signal $V_{PIXEL1}$ is greater than the second pixel signal $V_{PIXEL2}$, and FIG. 4C show a control signal timing when the first pixel signal $V_{PIXEL1}$ is smaller than the second pixel signal $V_{PIXEL2}$.

As shown in FIG. 4A, the analog-digital converting device according to an embodiment of the present invention includes a comparison block 401, a feedback control unit 402, a selection block 403 and a data conversion unit 404.

The comparison block 401 corresponds to the comparator included in the comparison block 340 and compares the first pixel signal $V_{PIXEL1}$ with the second pixel signal $V_{PIXEL2}$ of a neighboring column, and outputs a first comparison signal. Further, the comparison block 401 compares each of the first and second pixel signals $V_{PIXEL1}$ and $V_{PIXEL2}$ with the ramp signal $V_{RAMP}$ through a single ramping operation, and then outputs a second comparison signal.

The feedback control unit 402 determines a data conversion sequence, i.e., the sequence of the comparison between the first pixel signal $V_{PIXEL1}$ with the ramp signal $V_{RAMP}$ and the comparison between the second pixel signal $V_{PIXEL2}$ with the ramp signal $V_{RAMP}$, based on the first comparison signal, and outputs first to fourth switch control signals $SC_1$ to $SC_4$ for controlling first to fourth switches $S_1$ to $S_4$.

The selection block 403 includes a first switch S1 between a first column wiring line that carries the first pixel signal $V_{PIXEL1}$ and a first node N1. The selection block 403 also includes a second switch and a third switches S2 and S3. The second switch is between a second column wiring line that carries the second pixel signal $V_{PIXEL1}$ and the first node N1. The third switch S3 is coupled between the second column wiring line that carries the second pixel signal $V_{PIXEL1}$ and a second node N2. The first and second nodes N1 and N2 are coupled to first and second input lines of the comparison block 401, respectively. A fourth switch S4 is coupled between the Vramp line coming from the ramp signal generation unit 330 and the second node N2. The selection block 403 receives the first and second pixel signals $V_{PIXEL1}$ a and $V_{PIXEL2}$ and the ramp signal $V_{RAMP}$ respectively through first to third input terminals, and selects the first and second pixel signals $V_{PIXEL1}$ and $V_{PIXEL2}$ and the ramp signal $V_{RAMP}$ in response to the first to fourth switch control signals $SC_1$ to $SC_4$ outputted from the feedback control unit 402. The selection block 403 is illustrated as a switch 331 in FIG. 3, for simplicity.

The data conversion unit 404 performs a data conversion on the pixel signals based on the second comparison signal outputted from the comparison block 401.

Herein, the analog-digital converting device shown in FIG. 4A removes an offset by resetting the comparison block 401 using a reference pixel signal, compares the first pixel signal $V_{PIXEL1}$ with the second pixel signal $V_{PIXEL2}$ to determine the data conversion sequence, generates the first to fourth switch control signals $SC_1$ to $SC_4$ for selecting the ramp signal, the first pixel signal and the second pixel signal as input signals to the comparison block 401 according to the determined data conversion sequence, compares the ramp signal $V_{RAMP}$ with each of the first and second pixel signals $V_{PIXEL1}$ and $V_{PIXEL2}$ through a single ramping operation according to the first to fourth switch control signals $SC_1$ to $SC_4$.

For example, the comparison block 401 may be implemented using the comparator 341, a first capacitor C1, a second capacitor C2 and two feedback switches $S_R$. The selection block 403 may be implemented using the first to fourth switches $S_1$ to $S_4$, or using a combination of various switches.

The data conversion unit 404 receives the second comparison signal, which is outputted from the comparison block 401, directly or via the feedback control unit 402 as shown in FIG. 4A. The data conversion unit 404 corresponds to both of the counter 351 and the memory 361.

An operation of the analog-digital converting device will be described as below with reference to FIGS. 4A to 4D.

A process of the analog-digital converting device includes the sequence of a reset operation, a data conversion sequence determination operation and a data conversion operation.

The analog-digital converting device removes an offset by resetting the comparator 341 using a reference pixel signal at step S411.

For example, the first pixel signal $V_{PIXEL1}$ is used as the reference pixel signal.

More specifically, the two feedback switches $S_R$ are switched on under the control of the control unit 380, the second and third switches $S_2$ and $S_3$ are switched on in response to the second and third switch control signals $SC_2$ and $SC_3$, and the first and fourth switches $S_1$ and $S_4$ are switched off. When the second and third switches $S_2$ and $S_3$ are switched on, a value of the first pixel signal $V_{PIXEL1}$, which is Inputted through the first and second input terminals, is stored in the first and second capacitors $C_1$ and $C_2$ of the comparison block 401. Herein, the offset value of the comparator 341 is stored in the first and second capacitors $C_1$ and $C_2$, and then, the comparison block 401 removes the offset of the comparator 341 by resetting the comparator 341 on a basis of the first pixel signal $V_{PIXEL1}$ stored in the first and second capacitors $C_1$ and $C_2$.

Subsequently, the analog-digital converting device compares the first and second pixel signals $V_{PIXEL1}$ and $V_{PIXEL2}$, determines the data conversion sequence, and generates the first to fourth switch control signals $SC_1$ to $SC_4$ for selecting the first and second pixel signals $V_{PIXEL1}$ and $V_{PIXEL2}$ and the ramp signal $V_{RAMP}$ applied to the comparison block 401 according to the determined data conversion sequence at step S412.

That is, the analog-digital converting device compares the first and second pixel signals $V_{PIXEL1}$ and $V_{PIXEL2}$. If a voltage of the first pixel signal $V_{PIXEL1}$ is higher than a voltage of the second pixel signal $V_{PIXEL2}$, the conversion sequence is determined to be the first pixel signal $V_{PIXEL1}$ first followed by the second pixel signal $V_{PIXEL2}$. If the voltage of the first pixel signal $V_{PIXEL1}$ is lower than the voltage of the second pixel signal $V_{PIXEL2}$, then the conversion sequence is reversed with the second pixel signal $V_{PIXEL2}$ converted first followed by the first pixel signal $V_{PIXEL1}$.

In order to determine the data conversion sequence, two feedback switches $S_R$ are switched off under the control of the control unit 380, the first switch $S_1$ is switched on according to the first switch control signal $SC_1$, and the second switch $S_2$ is switched off according to the second switch control signal $SC_2$. That is, the first switch $S_1$ is switched on while the third switch $S_3$ stays switched on, thus the value of the second pixel signal $V_{PIXEL2}$ inputted through the second input terminal is stored in the first capacitor $C_1$ and the comparison block 401 compares the first pixel signal $V_{PIXEL1}$ with the second pixel signal $V_{PIXEL2}$ which are respectively stored in the first and second capacitors $C_1$ and $C_2$. The comparison block 401 outputs the first comparison signal to the feedback control unit 402.

If the voltage of the first pixel signal $V_{PIXEL1}$ is higher than the voltage of the second pixel signal $V_{PIXEL2}$, the feedback control unit 402 determines the data conversion sequence to be the first pixel signal $V_{PIXEL1}$ first followed by the second pixel signal $V_{PIXEL2}$. The feedback control unit 402 generates the second and fourth switch control signals $SC_2$ and $SC_4$ for switching on the second and fourth switches $S_2$ and $S_4$. The feedback control unit also generates the first and third switch control signals $SC_1$ and $SC_3$ for switching off the first and third switches $S_1$ and $S_3$. Then, the second pixel signal $V_{PIXEL2}$ and the ramp signal $V_{RAMP}$ may be applied to the comparison block 401. When a first comparison time elapses, the feedback control unit 402 generates the first switch control signal $SC_1$ for switching on the first switch $S_1$ and the second switch control signal $SC_2$ for switching off the second switch $S_2$ while keeping the fourth switch $S_4$ switched on, as illustrated in FIG. 4B.

Meanwhile, if the voltage of the first pixel signal $V_{PIXEL1}$ is lower than the voltage of the second pixel signal $V_{PIXEL2}$, the feedback control unit 402 determines the data conversion sequence to be the second pixel signal $V_{PIXEL2}$ first followed by the first pixel signal $V_{PIXEL1}$. While keeping the first switch $S_1$ switched on and the second switch $S_2$ switched off, the feedback control unit 402 generates the fourth switch control signal $SC_4$ for switching on the fourth switch $S_4$ of the ramp signal $V_{RAMP}$ applied to the comparison block 401, and generates the third switch control signal $SC_3$ for switching off the third switch $S_3$. And then, when the first comparison time elapses, the feedback control unit 402 generates the first switch control signal $SC_1$ for switching off the first switch $S_1$ and generates the second switch control signal $SC_2$ for switching on the second switch $S_2$ while keeping the fourth switch $S_4$ switched on, as illustrated in FIG. 4C.

The analog-digital converting device compares the first and second pixel signals $V_{PIXEL1}$ and $V_{PIXEL2}$ with the ramp signal $V_{RAMP}$ through a single ramping operation according to the determined data conversion sequence at step S413.

That is, the analog-digital converting device selects the first and second pixel signals $V_{PIXEL1}$ and $V_{PIXEL2}$ and the ramp signal $V_{RAMP}$, outputs the second comparison signal by comparing each of the first and second pixel signals $V_{PIXEL1}$ and $V_{PIXEL2}$ with the ramp signal $V_{RAMP}$ through a single ramping operation, and performs the data conversion according to the determined data conversion sequence.

When the first to fourth switch control signals $SC_1$ to $SC_4$ are generated to perform the data conversion according to the data conversion sequence as the first and second pixel signals $V_{PIXEL1}$ and $V_{PIXEL2}$, the analog-digital converting device selects the ramp signal $V_{RAMP}$ according to the fourth switch control signal $SC_4$, switches off the first and third switches $S_1$ and $S_3$ according to the first and third switch control signals $SC_1$ and $SC_3$, switches on the second switch $S_2$ according to the second switch control signal $SC_2$, and compares the first pixel signal $V_{PIXEL1}$ with the ramp signal $V_{RAMP}$. And then, while keeping the fourth switch $S_4$ switched on, the analog-digital converting device switches on the first switch $S_1$ according to the first switch control signal $SC_1$, switches off the second switch $S_2$ according to the second switch control signal $SC_2$, compares the second pixel signal $V_{PIXEL2}$ with the ramp signal $V_{RAMP}$. Then, the analog-digital converting device performs the data conversion sequentially on the first and second pixel signals $V_{PIXEL1}$ and $V_{PIXEL2}$ through a single ramping operation, as illustrated in FIG. 4B.

Meanwhile, when the first to fourth switch control signals $SC_1$ to $SC_4$ are generated to perform the data conversion according to the data conversion sequence as the second and first pixel signals $V_{PIXEL12}$ and $V_{PIXEL1}$, the analog-digital converting device selects the ramp signal $V_{RAMP}$ according to the fourth switch control signal $SC_4$, switches off the first switch $S_3$ according to the third switch control signal $SC_3$ while keeping the first switch $S_1$ switched on and the second switch $S_2$ switched off, and compares the second pixel signal $V_{PIXEL2}$ with the ramp signal $V_{RAMP}$. And then, while keeping the fourth switch $S_4$ switched on, the analog-digital converting device switches off the first switch $S_1$ according to the first switch control signal $SC_1$, switches on the second switch $S_2$ according to the second switch control signal $SC_2$, and compares the first pixel signal $V_{PIXEL1}$ with the ramp signal $V_{RAMP}$. Then, the analog-digital converting device performs the data conversion sequentially on the second and first pixel signals $V_{PIXEL2}$ and $V_{PIXEL1}$ through a single ramping operation, as illustrated in FIG. 4C.

Figure 5A:
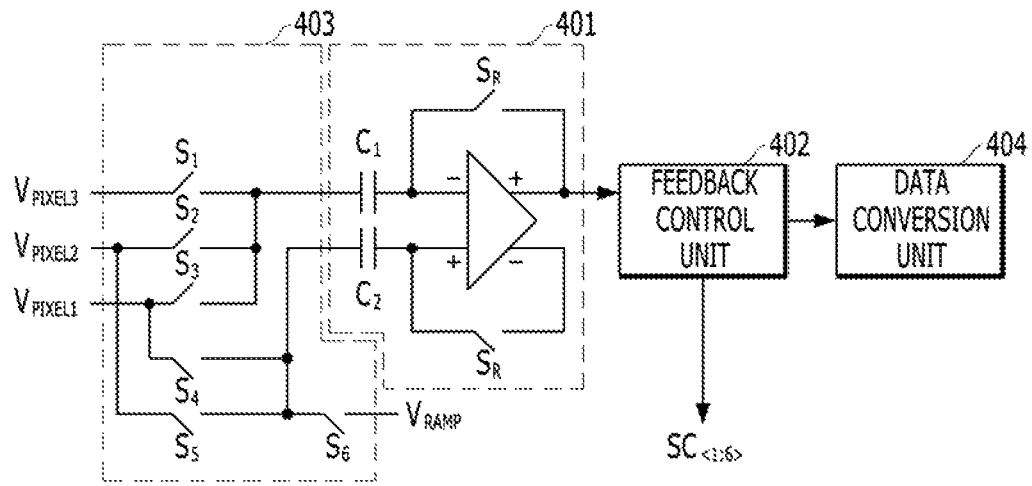
FIG. 5A is a block diagram illustrating another exemplary configuration of an analog-digital converting device shown in FIG. 3.
Figure 5B:
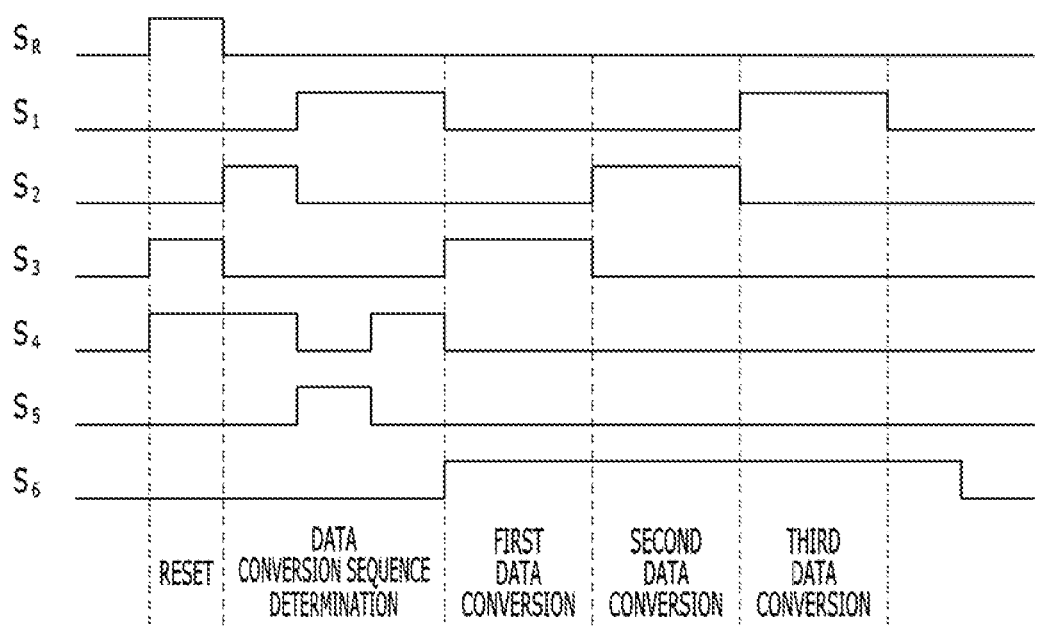
FIG. 5B is a timing diagram illustrating control signals of the analog-digital converting device shown in FIG. 5A.

FIG. 5A is a block diagram illustrating another exemplary configuration of an analog-digital converting device that may be employed in the image sensor of FIG. 3. FIG. 5B is a timing diagram Illustrating control signals of the analog-digital converting device shown in FIG. 5A.

FIG. 5A shows a case that a single analog-digital converting device processes first to third pixel signals $V_{PIXEL1}$ to $V_{PIXEL3}$ of three columns through a single ramping operation. FIG. 5B shows a control signal timing of a case that the first pixel signal $V_{PIXEL1}$ is greater than the second pixel signal $V_{PIXEL}$, which is greater than the third pixel signal $V_{PIXEL3}$. In this case, the CMOS image sensor of FIG. 3 may be modified such that a single analog-digital converting device per three columns.

As shown in FIG. 5A, the analog-digital converting device in accordance with another embodiment of the present invention includes a comparison block 401, a feedback control unit 402, a selection block 403 and a data conversion unit 404.

The analog-digital converting device in accordance with another embodiment of the present invention removes an offset by resetting the comparator 341 using a reference pixel signal, compares first to third pixel signals $V_{PIXEL1}$ to $V_{PIXEL3}$ with each other to determine a data conversion sequence, generates a control signal for selecting the first to third pixel signals $V_{PIXEL1}$ to $V_{PIXEL3}$ and the ramp signal $V_{RAMP}$ applied to the comparison block 401 according to the determined data conversion sequence, and compares each of the first to third pixel signals $V_{PIXEL1}$ to $V_{PIXEL3}$ with the ramp signal $V_{RAMP}$ through one raping operation for data conversion according to the control signal.

The selection block 403 shown in FIG. 5A may include first to sixth switches $S_1$ to $S_6$, or various combination of switches. The feedback control unit 402 shown in FIG. 5A generates first to sixth switch control signals $SC_1$ to $SC_6$ as the control signal for controlling the first to sixth switches $S_1$ to $S_6$.

The analog-digital converting device shown in FIG. 5A are similar to the analog-digital converting device shown in FIGS. 4A and 4D, and thus the detailed description will be omitted.

Referring to FIG. 5B, in case that a voltage of the first pixel signal $V_{PIXEL1}$ is higher than a voltage of the second pixel signal $V_{PIXEL2}$, which is higher than a voltage of the third pixel signal $V_{PIXEL3}$, an operation of the analog-digital converting device will be described as below.

Referring to FIGS. 5A and 5B, two feedback switches $S_R$ are switched on under the control of the control unit 380, and the third and fourth switches $S_3$ and $S_4$ are switched on according to the third and fourth switch control signals $SC_3$ and $SC_4$ outputted from the feedback control unit 402. The first, second, fifth and sixth switches $S_1$, $S_2$, $S_5$ and $S_6$ are switched off according to the first, second, fifth and sixth switch control signals $SC_1$, $SC_2$, $S_5$ and $S_6$. While keeping the third and fourth switch $S_3$ and $S_4$ switched on, a value of the first pixel signal $V_{PIXEL1}$ inputted through the first and second input terminals is stored on first and second capacitors $C_1$ and $C_2$. Thus, the comparison block 401 removes the offset by resetting the comparator 341 based on the first pixel signal $V_{PIXEL1}$ stored on the first and second capacitors $C_1$ and $C_2$.

In order to determine the data conversion sequence, two feedback switches $S_R$ are switched off under the control of the control unit 380. While the fourth switch S4 is switched on, the third switch $S_3$ is switched off according to the third switch control signal $SC_3$ and the second switch $S_2$ is switched on according to the second switch control signal $SC_2$.

Herein, a value of the second pixel signal $V_{PIXEL1}$ Inputted through the second input terminal is stored on the first capacitor $C_1$, and thus the comparison block 401 compares the first pixel signal $V_{PIXEL1}$ with the second pixel signal $V_{PIXEL2}$, and outputs a first comparison signal to the feedback control unit 402.

While the fourth switch $S_4$ is switched on, the value of the first pixel signal $V_{PIXEL1}$ inputted through the first input terminal is stored on the second capacitor $C_2$. Thus, the comparison block 401 removes the offset by resetting the comparator 341 with reference to the first pixel signal $V_{PIXEL1}$ stored on the first and second capacitors $C_1$ and $C_2$.

While the second and fourth switches $S_2$ and $S_4$ are switched off according to the second and fourth switch control signals $SC_2$ and $SC_4$, and the first and fifth switches $S_1$ and $S_5$ are switched on according to the first and fifth switch control signals $SC_1$ and $SC_5$, if the value of the third pixel signal $V_{PIXEL3}$ inputted through the third input terminal is stored on the first capacitor $C_1$, and the value of the second pixel signal $V_{PIXEL2}$ inputted through the second input terminal is stored on the second capacitor $C_2$, the comparison block 401 compares the second pixel signal $V_{PIXEL2}$ with the third pixel signal $V_{PIXEL3}$, and outputs the first comparison signal to the feedback control unit 402.

While the first switch S1 is switched on, the fifth switch S5 is switched off according to the fifth switch control signal SC5, and the fourth switch S4 is switched on according to the fourth switch control signal SC4. Thus, if the value of the first pixel signal $V_{PIXEL1}$ inputted through the first Input terminal is stored on the second capacitor $C_2$, the comparison block 401 compares the first pixel signal $V_{PIXEL1}$ with the third pixel signal $V_{PIXEL3}$ and outputs the first comparison signal to the feedback control unit 402.

Therefore, if the voltage of the first pixel signal $V_{PIXEL1}$ is higher than the voltage of the second pixel signal $V_{PIXEL2}$, which IS higher than the voltage of the third pixel signal $V_{PIXEL3}$, the feedback control unit 402 determines the data conversion sequence as the first to third pixel signals $V_{PIXEL1}$ to $V_{PIXEL3}$ in this order, generates the sixth switch control signal $SC_6$ for selecting the ramp signal $V_{RAMP}$ applied to the comparison block 401, generates the first and fourth switch control signals $SC_1$ and $SC_4$ for switching off the first and fourth switches $S_1$ and $S_4$, and generates the third switch control signal $SC_3$ for switching on the third switch $S_3$. And then, if the second comparison time elapses, while keeping the sixth switch $S_6$ switched on, the feedback control unit 402 generates the first switch control signal $SC_1$ for switching on the first switch $S_1$ and generates the second switch control signal $SC_2$ for switching off the second switch $S_2$.

Subsequently, if the control signal is generated to perform the data conversion according to the sequence of the first to third pixel signals $V_{PIXEL1}$ to $V_{PIXEL3}$ in this order the analog-digital converting device selects the ramp signal $V_{RAMP}$ according to the six switch control signal $SC_6$, switches off the first and fourth switches $S_1$ and $S_4$ according to the first and fourth switch control signals $SC_1$ and $SC_4$, switches on the third switch $S_3$ according to the third switch control signal $SC_3$, and compares the first pixel signal $V_{PIXEL1}$ with the ramp signal $V_{RAMP}$. And then, while the sixth switch $S_6$ is switched on, the second switch $S_2$ is switched on according to the second switch control signal $SC_2$, the third switch $S_3$ is switched off according to the third switch control signal $SC_3$, and the second pixel signal $V_{PIXEL2}$ is compared with the ramp signal $V_{RAMP}$. And then, while the six switch $S_6$ is switched on, the first switch $S_1$ is switched on according to the first switch control signal $SC_1$, the second switch $S_2$ is switched off according to the second switch control signal $SC_2$, the third pixel signal $V_{PIXEL3}$ is compared with the ramp signal $V_{RAMP}$, and the data conversion is performed on the first to third pixel signals $V_{PIXEL1}$ to $V_{PIXEL3}$ in this order through a single ramping operation.

Figure 6A:
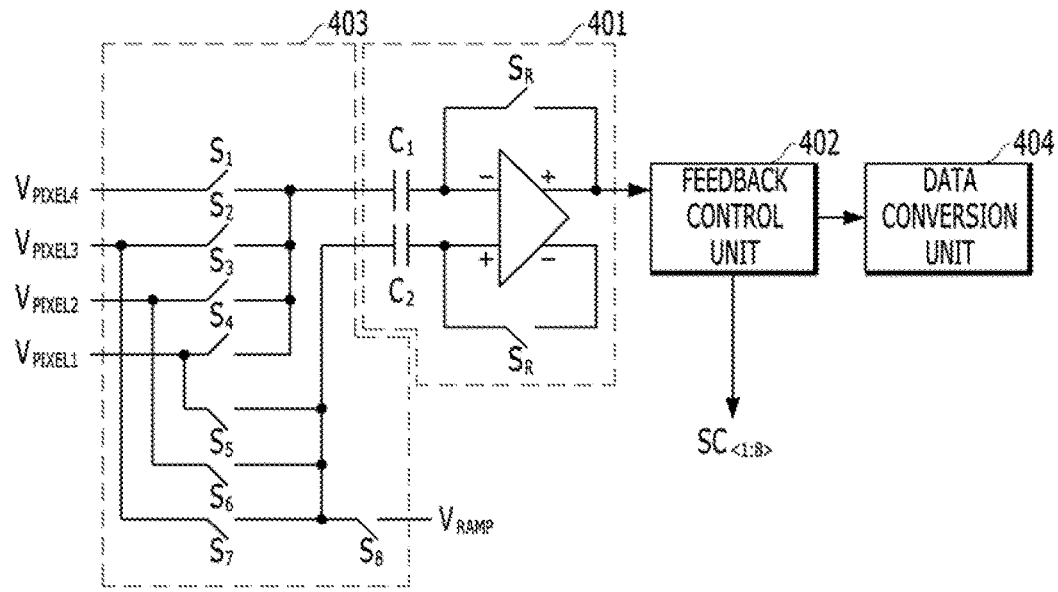
FIG. 6A is a block diagram illustrating yet another exemplary configuration of an analog-digital converting device shown in FIG. 3.
Figure 6B:
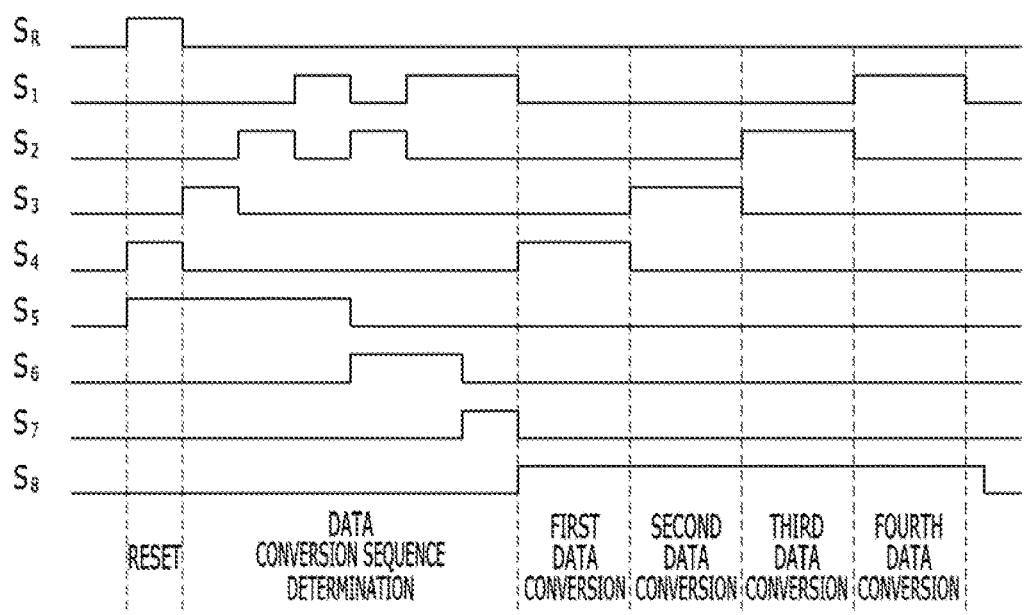
FIG. 6B is a timing diagram illustrating control signals of the analog-digital converting device shown in FIG. 6A.

FIG. 6A is a block diagram Illustrating yet another exemplary configuration of an analog-digital converting device. FIG. 6B is a timing diagram illustrating control signals of the analog-digital converting device shown in FIG. 6A.

FIG. 6A shows a case that a single analog-digital converting device processes first to fourth pixel signals $V_{PIXEL1}$ to $V_{PIXEL4}$ of four columns through a single ramping operation. FIG. 6B shows a control signal timing of a case that a voltage of the first pixel signal $V_{PIXEL1}$ is higher than a voltage of the second pixel signal $V_{PIXEL2}$ and the voltage of the second pixel signal $V_{PIXEL2}$ is higher than a voltage of the third pixel signal $V_{PIXEL3}$, which is higher than a voltage of the fourth pixel signal $V_{PIXEL4}$. In this case, the CMOS image sensor of FIG. 3 may be modified such that a single analog-digital converting device is employed for every four columns.

Referring to FIG. 6A, the analog-digital converting device in accordance with another embodiment of the present invention includes a comparison block 401, a feedback control unit 402, a selection block 403 and a data conversion unit 404.

The analog-digital converting device removes the offset by resetting the comparator 341 using a reference pixel signal, compares first to fourth pixel signals $V_{PIXEL1}$ to $V_{PIXEL4}$ with each other to determine a data conversion sequence, generates a control signal for selecting the first to fourth pixel signals $V_{PIXEL1}$ to $V_{PIXEL4}$ and the ramp signal $V_{RAMP}$ according to the determined data conversion sequence, and compares each of the first to fourth pixel signals $V_{PIXEL1}$ to $V_{PIXEL4}$ with the ramp signal $V_{RAMP}$ through a single ramping operation for data conversion according to the control signal.

The selection block 403 shown in FIG. 6A may include first to eighth switch $S_1$ to $S_8$ or various combination of switches. The feedback control unit 402 shown in FIG. 6A generates first to eighth switch control signals $SC_1$ to $SC_8$ as the control signal for controlling first to eighth switches $S_1$ to $S_8$.

The analog-digital converting device shown in FIG. 6A are similar to the analog-digital converting device shown in FIGS. 4A and 4D, and thus the detailed descriptions will be omitted.

Referring to FIG. 6B, in case that voltages of the first to fourth pixel signals $V_{PIXEL1}$ to $V_{PIXEL4}$ becomes lower in ascending order, an operation of the analog-digital converting device will be described as below.

Referring to FIGS. 6A and 6B, two feedback switches $S_R$ are switched on under the control of the control unit 380, the fourth and fifth switches $S_4$ and $S_5$ are switched on according to the fourth and fifth switch control signals $SC_4$ and $SC_5$, and the first to third and sixth to eighth switches $S_1$ to $S_3$ and $S_6$ to $S_5$ are switched off. When the fourth and fifth switches $S_4$ and $S_5$ are switched on, a value of the first pixels signal $V_{PIXEL1}$ inputted through a first input terminal is stored on first and second capacitors $C_1$ and $C_2$. And then, the comparison block 401 removes the offset by resetting the comparator 341 on a basis of the first pixel signal $V_{PIXEL1}$ stored on the first and second capacitor $C_1$ and $C_2$.

In order to determine the data conversion sequence, when the two feedback switches $S_R$ are switched off under the control of the control unit 380, the third and fifth switches $S_3$ and $S_5$ are switched on according to the third and fifth switch control signals $SC_3$ and $SC_5$, and the fourth switch $S_4$ is switched off according to the fourth switch control signal $SC_4$, the value of the second pixel signal $V_{PIXEL2}$ inputted through the second input terminal is stored on the first capacitor $C_1$, the comparison block 401 compares the first pixel signal $V_{PIXEL1}$ with the second pixel signal $V_{PIXEL2}$, and outputs the first comparison signal to the feedback control unit 402.

When the second and fifth switches $S_2$ and $S_5$ are switched on according to the second and fifth switch control signals $SC_2$ and $SC_5$ and the third switch $S_3$ is switched off according to the third switch control signal $SC_3$, the value of the third pixel signal $V_{PIXEL3}$ inputted through a third input terminal is stored on the first capacitor $C_1$, the comparison block 401 compares the first pixel signal $V_{PIXEL1}$ with the third pixel signal $V_{PIXEL3}$ and outputs the first comparison signal to the feedback control unit 402.

When the first and fifth switches $S_1$ and $S_5$ are switched on according to the first and fifth switch control signals $SC_1$ and $SC_5$ and the second switch $S_2$ is switched off according to the second switch control signal $SC_2$, the value of the fourth pixel signal $V_{PIXEL4}$ inputted through a fourth input terminal is stored on the first capacitor $C_1$, the comparison block 401 compares the first pixel signal $V_{PIXEL1}$ with the fourth pixel signal $V_{PIXEL4}$ and outputs the first comparison signal to the feedback control unit 402.

When the first and fifth switches $S_1$ and $S_5$ are switched off according to the first and fifth switch control signals $SC_1$ and $SC_5$ and the second and sixth switches $S_2$ and $S_6$ are switched on according to the second and sixth switch control signals $SC_2$ and $SC_6$, the value of the third pixel signal $V_{PIXEL3}$ inputted through the third input terminal is stored on the first capacitor $C_1$, and the value of the second pixel signal $V_{PIXEL2}$ inputted through the second input terminal is stored on the second capacitor $C_2$, the comparison block 401 compares the second pixel signal $V_{PIXEL2}$ with the third pixel signal $V_{PIXEL3}$ and outputs the first comparison signal to the feedback control unit 402.

When the first and sixth switches $S_1$ and $S_6$ are switched on according to the first and sixth switch control signals $SC_1$ and $SC_6$ and the second switch $S_2$ is switched off according to the second switch control signal $SC_2$, the value of the fourth pixel signal $V_{PIXEL4}$ inputted through the fourth input terminal is stored on the first capacitor $C_1$, the comparison block 401 compares the second pixel signal $V_{PIXEL2}$ with the fourth pixel signal $V_{PIXEL4}$ and outputs the first comparison signal to the feedback control unit 402.

When the first and seventh switches $S_1$ and $S_7$ are switched on according to the first and seventh switch control signals $SC_1$ and $SC_7$ and the sixth switch $S_6$ is switched off according to the sixth switch control signal $SC_6$, the value of the third pixel signal $V_{PIXEL3}$ inputted through the third input terminal is stored on the second capacitor $C_2$, the comparison block 401 compares the third pixel signal $V_{PIXEL3}$ with the fourth pixel signal $V_{PIXEL4}$ and outputs the first comparison signal to the feedback control unit 402.

Thus, if the voltages of the first to fourth pixel signals $V_{PIXEL1}$ to $V_{PIXEL4}$ become lower at ascending order, the feedback control unit 402 determines the data conversion sequence as the sequence of the first to fourth pixel signals $V_{PIXEL1}$ to $V_{PIXEL4}$ in this order generates the eighth switch control signal $SC_8$ for selecting the ramp signal $V_{RAMP}$ applied to the comparison block 401, generates the first and seventh switch control signals $SC_1$ and $SC_7$ for switching off the first and seventh switches $S_1$ and $S_7$, and generates the fourth switch control signal $SC_4$ for switching on the fourth switch $S_4$. And then, when first comparison time elapses and the eighth switch S8 is switched on, the feedback control unit 402 generates the third switch control signal $SC_3$ for switching on the third switch $S_3$, and generates the fourth switch control signal $SC_4$ for switching off the fourth switch $S_4$. And then, when a second comparison time elapses and the eighth switch S8 is switched on, the feedback control unit 402 generates the second switch control signal $SC_2$ for switching on the second switch $S_2$, and generates the third switch control signal $SC_3$ for switching off the third switch $S_3$. And then, when third comparison time elapses and the eighth switch S8 is switched on, the feedback control unit 402 generates the first switch control signal $SC_1$ for switching on the first switch $S_1$, and generates the second switch control signal $SC_2$ for switching off the second switch $S_2$.

Subsequently, if the control signal is generated to perform the data conversion according to the sequence of the first to fourth pixel signals $V_{PIXEL1}$ to $V_{PIXEL4}$ in this order the analog-digital converting device selects the ramp signal $V_{RAMP}$ applied to the comparison block 401 according to the eighth switch control signal $SC_8$, switches off the first and seventh switches $S_1$ and $S_7$ according to the first and seventh switch control signals $SC_1$ and $SC_7$, switches on the fourth switch $S_4$ according to the fourth switch control signal $SC_4$, and compares the first pixel signal $V_{PIXEL1}$ with the ramp signal $V_{RAMP}$. And then, while the eighth switch $S_8$ is switched on, the analog-digital converting device switches on the third switch $S_3$ according to the third switch control signal $SC_3$, switches off the fourth switch $S_4$ according to the fourth switch control signal $SC_4$, and compares the ramp signal $V_{RAMP}$ with the second pixel signal $V_{PIXEL2}$. And then, while the eighth switch $S_8$ is switched on, the analog-digital converting device switches on the second switch $S_2$ according to the second switch control signal $SC_2$, switches off the third switch $S_3$ according to the third switch control signal $SC_3$, and compares the ramp signal $V_{RAMP}$ with the third pixel signal $V_{PIXEL3}$. And then, while the eight switch $S_8$ is switched on, the analog-digital converting device switches on the first switch $S_1$ according to the first switch control signal $SC_1$, switches off the second switch $S_2$ according to the second switch control signal $SC_2$, compares the ramp signal $V_{RAMP}$ with the fourth pixel signal $V_{PIXEL4}$, and performs the data conversion on the first to fourth pixel signals $V_{PIXEL1}$ to $V_{PIXEL4}$ in order through one ramping operating.

Although various embodiments of the present invention have been described for illustrative purposes, it will be apparent to those skilled in the art that various changes and modifications may be made without departing from the spirit and scope of the invention as defined in the following claims.

What is claimed is:

1. An analog-digital converting device, comprising:
a comparison block suitable for generating at least one first comparison signal by comparing a plurality of pixel signals with each other, and for generating a plurality of second comparison signals by comparing each of the plurality of pixel signals with a ramp signal through a single ramping operation;
a feedback control unit suitable for determining a data conversion sequence according to the at least one first comparison signal received from the comparison block, and outputting a control signal according to the determined data conversion sequence;
a selection block suitable for selecting two of the plurality of the pixel signals or at least one of the plurality of the pixel signals and the ramp signal to be applied to the comparison block according to the control signal received from the feedback control unit; and
a data conversion unit suitable for performing a data conversion on the plurality of pixel signals based on the second comparison signal.

2. The analog-digital converting device of claim 1,
wherein the comparison block includes a comparator suitable for comparing the selected pixel signals among the plurality of pixel signals with each other, and for comparing a selected pixel signal among the plurality of pixel signals with the ramp signal, and
wherein the comparison block further removes an offset by resetting the comparator through a reference pixel signal.

3. The analog-digital converting device of claim 1, wherein the comparison block compares each of the plurality of pixel signals, which are selected according to the control signal, with the ramp signal according to the determined data conversion sequence.

4. An analog-digital converting method, comprising:
performing a reset operation;
generating a first comparison signal by comparing a plurality of pixel signals with each other;
determining a data conversion sequence according to the first comparison signal;
generating a control signal according to the determined data conversion sequence;
selecting the plurality of pixel signals and a ramp signal according to the control signal; and
performing a data conversion on the plurality of pixel signals by comparing each of the plurality of pixel signals, which are selected according to the control signal, with the ramp signal through a single ramping operation.

5. The analog-digital converting method of claim 4, wherein the performing of the reset operation includes removing an offset for the comparing of the plurality of pixel signals with each other using a reference pixel signal.

6. A complementary metal oxide semiconductor (CMOS) image sensor, comprising:
a pixel array suitable for outputting a pixel signal corresponding to an incident light;
a row decoder suitable for selecting and controlling a pixel at each row lines of the pixel array;
a ramp signal generation unit suitable for generating a ramp signal;
a comparison unit suitable for comparing a plurality of pixel signals outputted from the pixel array, determining a data conversion sequence of the pixel signals, and comparing each of the plurality of pixel signals with the ramp signal through a single ramping operation;
a counting unit suitable for counting a clock according to a comparison signal of the comparison unit;
a memory unit suitable for storing a counting information of the counting unit; and
a column read-out circuit suitable for outputting a data of the memory unit.

7. The CMOS image sensor of claim 6, wherein the comparison unit includes
a comparison block suitable for generating a first comparison signal by comparing the plurality of pixel signals with each other, and generating a second comparison signal by comparing each of the plurality of pixel signals with the ramp signal through the single ramping operation;
a feedback control unit suitable for determining the data conversion sequence according to the first comparison signal, and outputting a control signal according to the determined data conversion sequence;
a selection block suitable for selecting the plurality of pixel signals and the ramp signal applied to the comparison block according to the control signal; and
a data conversion unit suitable for performing a data conversion on the plurality of pixel signals based on the second comparison signal.

8. The CMOS image sensor of claim 7, wherein the comparison block includes a comparator suitable for comparing the selected pixel signals among the plurality of pixel signals with each other, and for comparing a selected pixel signal among the plurality of pixel signals with the ramp signal, and
wherein the comparison block further removes an offset by resetting the comparator through a reference pixel signal.

9. The CMOS image sensor of claim 8, wherein the comparison block compares each of the plurality of pixel signals, which are selected according to the control signal, with the ramp signal according to the determined data conversion sequence.

* * * * *